United States Patent
Hashimoto

(10) Patent No.: US 10,825,791 B2
(45) Date of Patent: Nov. 3, 2020

(54) INTERPOSER ASSEMBLY

(71) Applicant: Tyco Electronics Japan G.K., Kanagawa (JP)

(72) Inventor: Shinichi Hashimoto, Kanagawa (JP)

(73) Assignee: Tyco Electronics Japan G.K., Kanagawa (JP)

( * ) Notice: Subject to any disclaimer, the term of this patent is extended or adjusted under 35 U.S.C. 154(b) by 0 days.

(21) Appl. No.: 16/164,006

(22) Filed: Oct. 18, 2018

(65) Prior Publication Data

US 2019/0123013 A1 Apr. 25, 2019

(30) Foreign Application Priority Data

Oct. 23, 2017 (JP) ................. 2017-204566

(51) Int. Cl.
| | | |
|---|---|---|
| *H01L 23/00* | (2006.01) | |
| *H01L 23/498* | (2006.01) | |
| *H01R 12/71* | (2011.01) | |
| *H01R 13/24* | (2006.01) | |
| *H01R 33/74* | (2006.01) | |
| *H01R 13/46* | (2006.01) | |
| *H01R 13/40* | (2006.01) | |

(52) U.S. Cl.
CPC ........ *H01L 24/72* (2013.01); *H01L 23/49827* (2013.01); *H01R 12/714* (2013.01); *H01R 12/716* (2013.01); *H01R 13/2435* (2013.01); *H01R 13/40* (2013.01); *H01R 13/46* (2013.01); *H01R 33/74* (2013.01); *H01L 2924/1432* (2013.01)

(58) Field of Classification Search
CPC ............... H01R 12/714; H01R 12/716; H01R 13/2435; H01R 13/40; H01R 13/46; H01R 33/74; H01L 24/72; H01L 23/49827
USPC ......... 439/66, 591, 607.01, 862, 82; 29/884, 29/885; 174/260, 262, 250; 336/107; 361/769
See application file for complete search history.

(56) References Cited

U.S. PATENT DOCUMENTS

| | | | |
|---|---|---|---|
| 6,217,342 B1 | 4/2001 | Neidich et al. | |
| 6,290,507 B1 | 9/2001 | Neidich et al. | |
| 6,315,576 B1 * | 11/2001 | Neidich | ............. H01R 13/2435 439/591 |

(Continued)

FOREIGN PATENT DOCUMENTS

| | | |
|---|---|---|
| JP | 676897 A | 3/1994 |
| JP | 2004534366 A | 11/2004 |

(Continued)

*Primary Examiner* — Dao H Nguyen
(74) *Attorney, Agent, or Firm* — Barley Snyder

(57) ABSTRACT

An interposer assembly having a housing with contact positioning holes each having a first wall face and a second wall face. The interposer contact has a base portion with shoulder portions and contact arm portions. The base portion is closer to the first wall face. The contact arm portions are once bulged from both respective vertical ends of the base portion toward the first wall face and then curved toward the second wall face. The housing has a retaining protrusion and a pair of slit portions. The retaining protrusion retains the interposer contact inside the contact positioning hole. Each of the shoulder portions is inserted into the slit portion. The slit portion blocks the interposer contact from moving toward the second wall face.

16 Claims, 7 Drawing Sheets

(56) References Cited

U.S. PATENT DOCUMENTS

| | | | |
|---|---|---|---|
| 6,730,134 B2 | 5/2004 | Neidich | |
| 6,832,917 B1 | 12/2004 | Neidich | |
| 7,052,284 B2 * | 5/2006 | Liao | H01R 13/2435 |
| | | | 439/66 |
| 7,134,880 B2 * | 11/2006 | Arai | H01R 13/2435 |
| | | | 439/66 |
| 7,252,563 B2 * | 8/2007 | Ju | H01R 13/2435 |
| | | | 439/500 |
| 7,341,485 B2 * | 3/2008 | Polnyi | H01R 13/2435 |
| | | | 439/591 |
| 7,390,195 B2 * | 6/2008 | Liao | H01R 13/2435 |
| | | | 439/66 |
| 9,172,161 B2 * | 10/2015 | Walden | H01R 12/714 |
| 9,425,525 B2 * | 8/2016 | Walden | H01R 12/7082 |
| 9,882,296 B1 * | 1/2018 | Ju | H01R 12/7076 |
| 2007/0218764 A1 * | 9/2007 | Chang | H01R 13/2435 |
| | | | 439/607.01 |

FOREIGN PATENT DOCUMENTS

| | | | |
|---|---|---|---|
| JP | 2007518242 A | 7/2007 | |
| JP | 2016503946 A | 2/2016 | |

* cited by examiner

INTERPOSER ASSEMBLY

CROSS-REFERENCE TO RELATED APPLICATION

This application claims the benefit of Japanese Patent Application No. 2017-204566 filed in the Japan Patent Office on Oct. 23, 2017, the whole disclosure of which is incorporated herein by reference.

FIELD OF THE INVENTION

The present invention relates to an interposer assembly for electrically connecting two electronic components.

BACKGROUND

An interposer assembly is known that is positioned in an interposed state between an electronic component such as a large-scale CPU, for example, and an electronic component such as a circuit board, for example, for making an electrical connection between these electronic components. This interposer assembly is generally composed of a flat-plate-like insulation housing formed with multiple contact positioning holes and interposer contacts positioned in these multiple contact positioning holes, respectively. Each interposer contact is required to be stably positioned inside each contact positioning hole.

JP2007-518242A discloses an interposer assembly that has a substantially C-shaped contact equivalent to the above interposer contact. In this interposer assembly component, there is a contact passageway equivalent to the above contact positioning hole in a dielectric plate equivalent to the above housing. In the contact passageways, there is a protruding portion of a wall face of the dielectric plate. Then, two end points of a C shape of the C-shaped contact pinch the protruding portion of the wall face and thereby the contact is stably positioned in the contact passageway.

In the interposer assembly of JP2007-518242A mentioned above, the end points of the C-shaped terminal extend to a position of contact with the protruding portion of the contact passageway wall face. Sections of this contact between vertices coming into contact with the electronic components between which the interposer assembly is interposed and the end points of the C shape are portions not contributing to transmission of an electric signal. If these portions not contributing to transmission of an electric signal are long, susceptibility to noise is increased and signal reflection also occurs, which, in turn, contributes to an occurrence of disturbance of a transmission waveform, particularly, in high-speed signal transmission. In recent years, the speed of a transmission signal has become higher and higher and, therefore, the problem is how to shorten the length of the portion of the interposer contact not contributing to signal transmission.

SUMMARY

In accordance with the present invention, an interposer assembly has a housing and a plurality of elastically deformable interposer contacts. The housing has an upper face and a lower face parallel to each other. The housing also has a plurality of contact positioning holes each having a first wall face and a second wall face facing each other and penetrating between the upper face and the lower face of the housing. Each of the plurality of contact positioning holes has a pair of slit portions, a retaining protrusion formed on the first wall face of each of the plurality of contact positioning holes, and a plurality of elastically deformable interposer contacts each having a vertical dimension longer than a thickness of the housing between the upper face and the lower face while being unloaded, inserted into each of the contact positioning holes and elastically deformed by pressing a first electronic component toward the upper face and pressing a second electronic component toward the lower face to make electrical connection between the first electronic component and the second electronic component and retained inside the contact positioning hole by the retaining protrusion, and having a base portion having a pair of shoulder portions protruding from both sides in a widthwise direction transverse to a vertical direction and positioned closer to the first wall face and a pair of contact arm portions once bulged toward the first wall face starting on both upper and lower ends of the base portion, respectively, then curved toward the second wall face and extending toward each other via upper and lower vertice, respectively.

BRIEF DESCRIPTION OF THE DRAWINGS

FIGS. 6(A) to 6(C) are cross-sectional views of one contact positioning hole, showing the behavior of the interposer contact positioned inside the contact positioning hole.

DETAILED DESCRIPTION OF THE EMBODIMENT

Referring to FIGS. 1(A), 1(B), and 2(A) to 2(C), a housing 20 of an interposer assembly 10, constructed in accordance with the present invention is a plate-like insulating housing having an upper face 20A and a lower face 20B extending parallel to each other. Housing 20, has a plurality of contact positioning holes 21 penetrating between the upper face 20A and the lower face 20B. An interposer contact 30 is in each of these contact positioning holes 21.

Figure 1A:
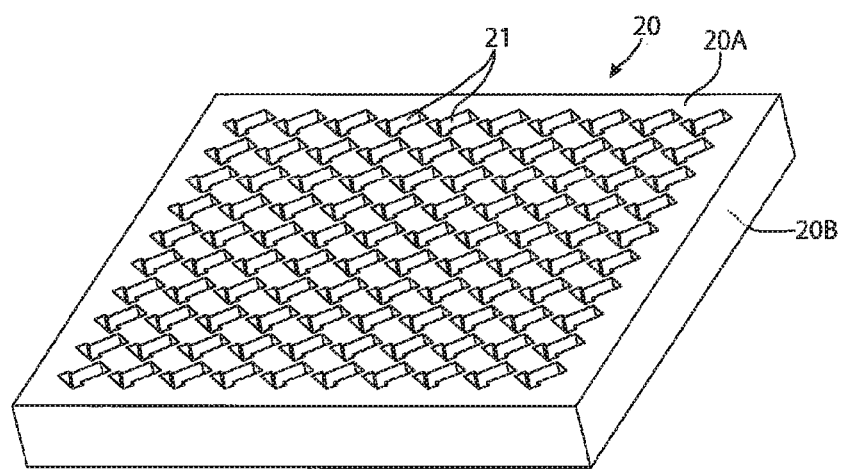
FIG. 1(A) is an isometric view of a housing constituting an interposer assembly as a first embodiment of the present invention and FIG. 1(B) is an isometric view of the FIG. 1(A) interposer assembly having interposer contacts positioned in the housing.
Figure 1B:
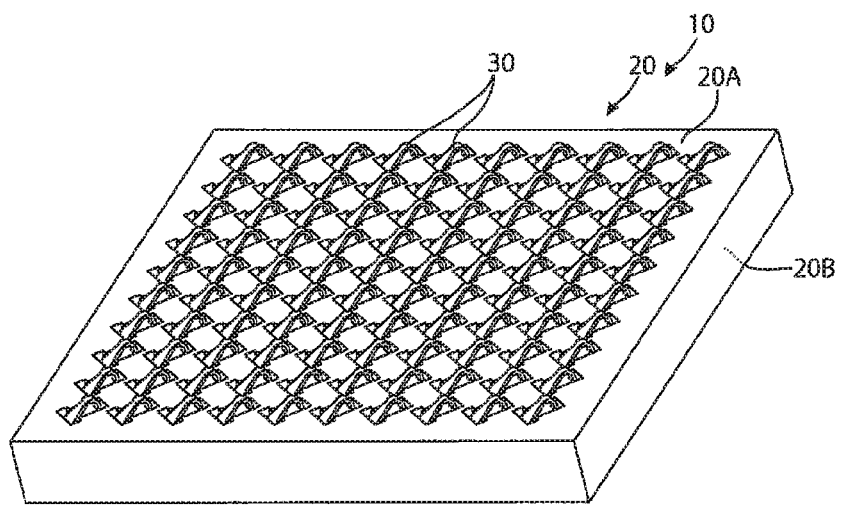
Figures 2A, 2B, 2C:
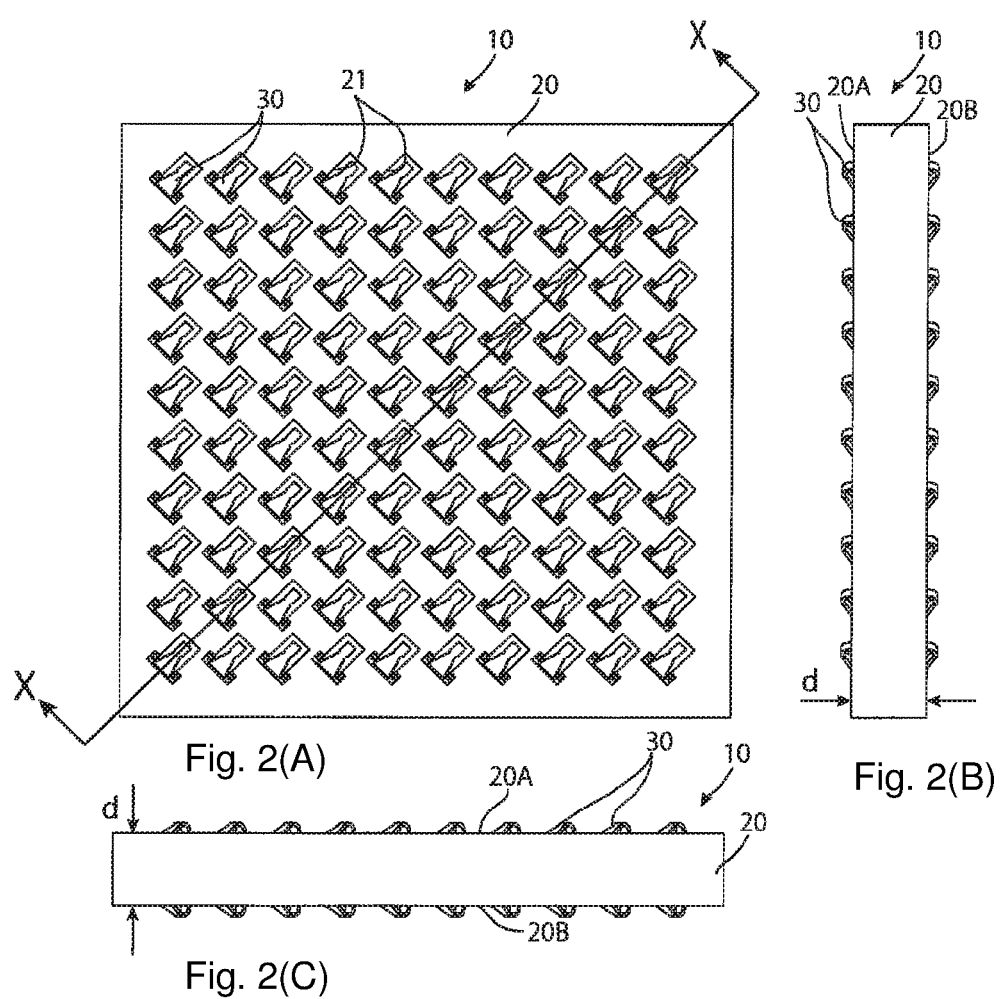
FIGS. 2(A) to 2(C) are views of three sides of the interposer assembly shown in FIG. 1(B)

The interposer contact 30 is a metallic component having resilience and has a lengthwise dimension longer than a thickness dimension d (see FIGS. 2(B) and 2(C)) between the upper face 20A and the lower face 20B of the housing 20 while unloaded. A first electronic component (not shown in FIG. 1(a) or 1(B)), such as a large-scale CPU, for example, is on the side of the upper face 20A of the housing 20 of this interposer assembly 10. A second electronic component (not shown in FIG. 1(A) or 1(B)), such as a circuit board, for example, is on the side of the lower face 20B of the housing 20 of this interposer assembly 10. The interposer contact 30 is pressed by the first electronic component and the second electronic component, thereby elastically deforming to come into contact with the first electronic component and the second electronic component with a predetermined pressing force.

Conductive pads are at positions corresponding to the respective interposer contacts 30 on faces of these first and second electronic components on the sides of which they press the interposer contacts 30. These first and second electronic components are electrically connected via these conductive pads and the interposer contacts 30.

Figure 3:
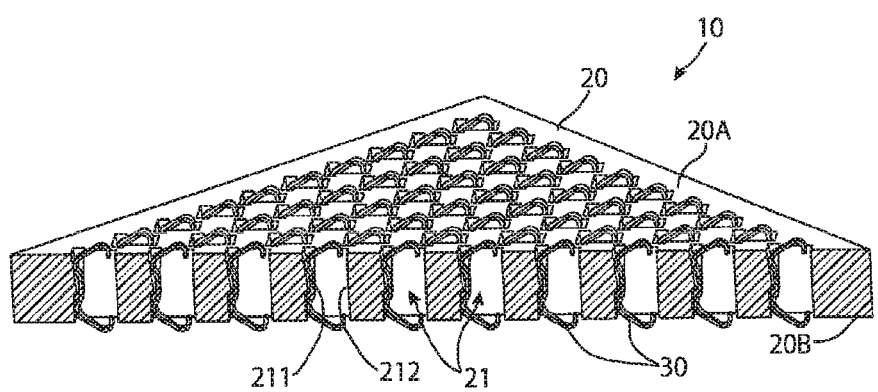
FIG. 3 is an isometric view, partially in cross-section taken along lines X-X in the FIG. 2(A) interposer assembly.
Figure 4:
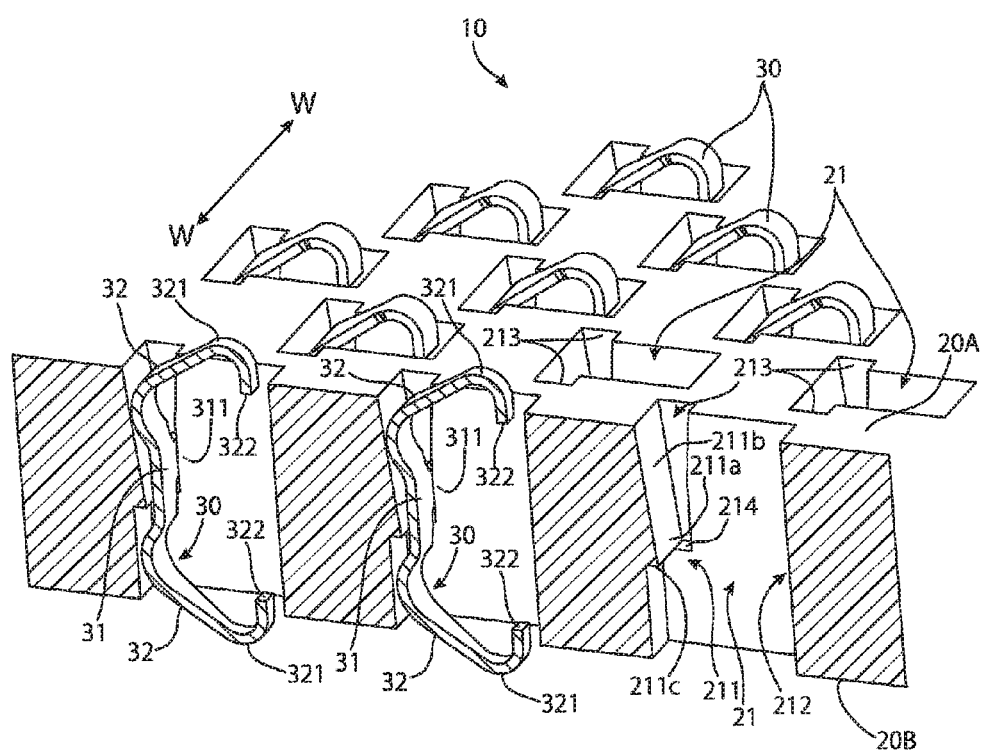
FIG. 4 is an enlarged view of a portion of FIG. 3 interposer assembly.

Referring to FIGS. 3 and 4, the shapes of the contact positioning holes 21 are shown with the interposer contacts 30 removed from some of the contact positioning holes 21 in order to show the shape of the contact positioning hole 21. The contact positioning hole 21 in the housing 20A has a first wall face 211 and a second wall face 212 facing each other as shown in FIG. 4. Furthermore, the first wall face 211 has a retaining protrusion 211a protruding into the contact positioning hole 21 substantially at a center in a vertical direction thereof. In addition, the contact positioning hole 21a has pair of slits 213 extending to both sides in a widthwise direction indicated by arrows W-W in FIG. 4. These slits 213 extend inside the contact positioning hole 21 from the upper face 20A to positions midway in the contact positioning hole 21 and terminate at catching portions 214 at the positions midway. The respective actions of the retaining protrusion 211a, the slit 213 and the catching portion 214 will be described below.

Figures 5A, 5B, 5C, 5D:
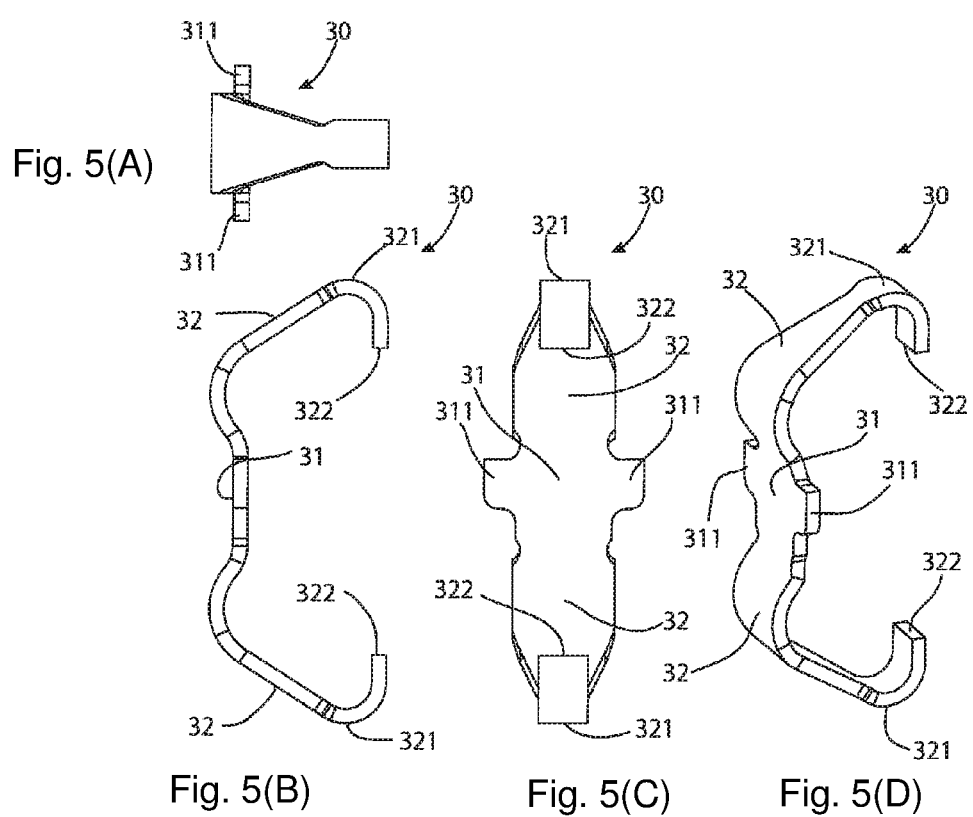
FIGS. 5(A) to 5(C) are views of three sides of the interposer contact and FIG. 5(D) is an isometric view thereof.

FIGS. 5(A) to 5(C) are views of three sides of the interposer contact and FIG. 5(D) is an isometric view thereof. This interposer contact 30 has a base portion 31 and a pair of contact arm portions 32. A pair of shoulder portions 311 protruding from both sides in the widthwise direction are in the base portion 31. When this interposer contact 30 is positioned inside the contact positioning hole 21, the base portion 31 is closer to the first wall face 211 inside the contact positioning hole 21 as shown in FIGS. 3 and 4. In addition, the pair of contact arm portions 32 of this interposer contact 30 are portions extending substantially vertically starting on both upper and lower ends of the base portion 31, respectively. These contact arm portions 32, in the state of the interposer contact 30 being inside the contact positioning hole 21, are once bulged toward the first wall face 211 and then curved toward the second wall face 212. Furthermore, these contact arm portions 32 extend toward each other via upper and lower vertice 321, respectively, and reach their respective end points 322.

This interposer contact 30 is inserted into the contact positioning hole 21 from the side of the upper face 20A of the housing 20. Thereupon, this interposer contact 30 gets over the retaining protrusion 211a while once elastically deforming the contact arm portion 32 connected to the bottom of the base portion 31. Then, this interposer contact 30, as shown in FIGS. 3 and 4, is inserted into the contact positioning hole 21 to a position where the base portion 31 faces the retaining protrusion 211a. At this time, the shoulder portions 311 protruding from both the sides in the widthwise direction of the base portion 31 abut against the catching portions 214 provided in the bottoms of the slits 213. Thereby, the interposer contact 30 cannot move any further toward the lower face 20B of the housing 20. In addition, in this interposer contact 30, portions of the pair of contact arm portions 32 connected to the top and bottom of the base portion 31 are bulged toward the first wall face 211. In other words, the base portion 31 is closer to the second wall face 212 than the portions connected to the top and bottom thereof.

Furthermore, the retaining protrusion 211a of the first wall face 211 faces the base portion 31 and simultaneously a portion of the lower contact arm portion 32 bulged toward the first wall face 211 is below the retaining protrusion 211a. Therefore, this interposer contact 30 is also prevented by the retaining protrusion 211a from escaping through the upper face 20A of the housing 20.

In addition, the shoulder portions 311 protruding from both the sides in the widthwise direction of the base portion 31 are inserted in the slits 213. Therefore, the interposer contact 30 inserted in the contact positioning hole 21 is blocked from moving toward the second wall face 212 since the shoulder portions 311 thereof are blocked by the slits 213.

In this manner, the interposer contact 30 is supported inside the contact positioning hole 21 with the portions connected to the top and bottom for transmitting a signal. Therefore, portions of the interposer contact 30 closer to the end points 322 than the vertice 321 only extend to positions of avoidance of direct contact with the electronic components pressing the interposer assembly 10, so that a length from the vertex 321 to the end point 322 can be shortened and the disturbance of the waveform of the signal passing through this interposer contact 30 is suppressed.

Figure 6A:
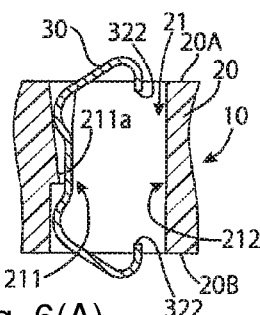
Figure 6C:
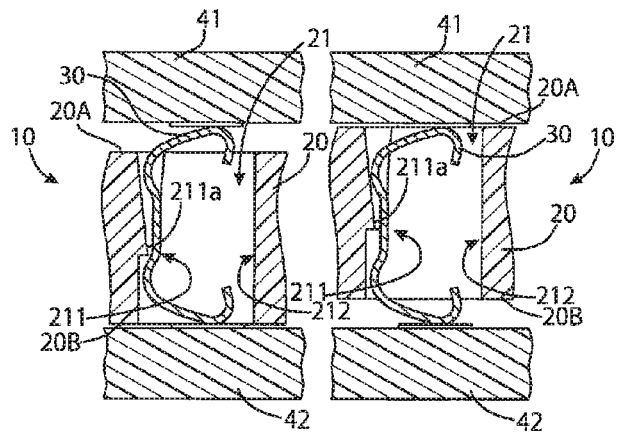

FIG. 6(A) to 6(C) are cross-sectional views of one contact positioning hole, showing the behavior of the interposer contact positioned inside the contact positioning hole. FIG. 6(A) shows the interposer assembly 10 in an unloaded state without being pressed by the electronic components. In addition, FIGS. 6(B-1) and 6(B-2) show only the one electronic component 41 (or the electronic component 42) of the two electronic components 41, 42 pressing the interposer assembly 10. FIG. 6(C) shows both the two electronic components 41, 42 pressing the interposer assembly 10.

Figure 6C:
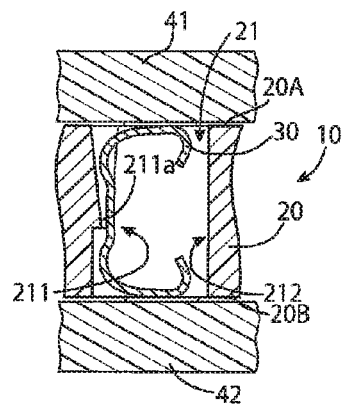

The interposer contact 30 is retained inside the contact positioning hole 21 both in the unloaded state (FIG. 6(A)) and in the state (FIGS. 6(B-1) and (B-2)) where only the one electronic component 41 (or the electronic component 42) of the two electronic components 41, 42 is pressing the interposer assembly 10. In addition, when both the two electronic components 41, 42 press the interposer assembly 10, the interposer contact 30 elastically deforms, as shown in FIG. 6(C), and comes into contact with each of the two electronic components 41, 42 with a suitable contact pressure. In this manner, this interposer contact 30 conducts an electrical signal transmitted between the two electronic components. In addition, this interposer contact 30 is spaced from the second wall face 212 in any state from FIG. 6(A) to FIG. 6(C), so that the disturbance of the signal waveform due to shortening the portion of the interposer contact 30 from the vertex 321 to the end point 322 is suppressed. In addition, as compared with the case where the interposer contact 30 is in contact with the second wall face 212, the elastic deformation when the electronic components 41, 42 are pressed becomes smooth. It should be noted that, as shown in FIG. 6(A), the end points 322 of the interposer contact 30 are inside the contact positioning hole 21 in the unloaded state. Therefore, the interposer contact 30 avoids being damaged by an external object getting caught at the end point 322.

Figure 7:
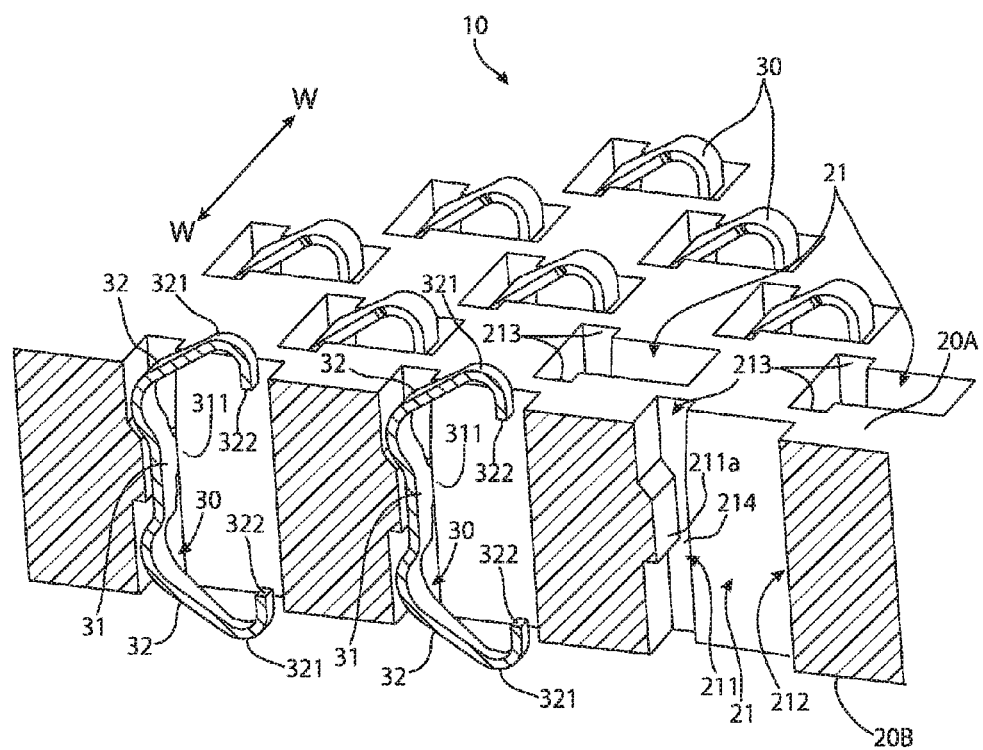
FIG. 7 shows a second embodiment of the interposer assembly constructed in accordance with the present invention.

FIG. 7 shows a second embodiment of the interposer assembly constructed in accordance with the present invention. FIG. 7 is a cross-sectional isometric view corresponding to FIG. 4 in the first embodiment of the present invention described above. Only differences from the first embodiment of the present invention described above will be described here.

There are two differences between the second embodiment of the present invention and the first embodiment of the present invention. One is a difference in the shape of the retaining protrusion 211a inside the contact positioning hole 21. In the first embodiment of the present invention described above, the retaining protrusion 211a is formed with a slope 211b continuing from the surface 20A of the housing 20 and a stepped portion 211c continuing into the slope 211b. In contrast, the retaining protrusion 211a in the second embodiment of the present invention shown in FIG. 7 is shaped such that both an upper face and a lower face thereof discontinuously protrude. The retaining protrusion 211a has shape that can function to retain the interposer contact 30.

The other difference between the second embodiment of the present invention and the first embodiment of the present invention is in the shape of the slit 213. In the case of the first embodiment of the present invention, as shown in FIG. 4, the slit 213 extends from the upper face 20A of the housing 20 to a position midway inside the contact positioning hole 21 and terminates at the catching portion 213a in the position midway. In contrast, in the case of the second embodiment of the present invention shown in FIG. 7, the slit 213 penetrates the upper face 20A and the lower face 20B of the housing 20. That is, in the case of this second embodiment of the present invention, the retaining of the interposer contact 30 inserted in the contact positioning hole 21 is due to the retaining protrusion 211a so that the interposer contact 30 cannot slip out through either the upper face 20A or the lower face 20B. Furthermore, the slit 213 does not take part in the retaining of the interposer contact 30. The slit 213 functions to block the interposer contact 30 inserted into the contact positioning hole 21 from moving toward the second wall face 212. Even with such a structure, using the portions of the interposer contact 30 connected to the top and bottom of the base portion 31 for transmitting a signal up and down, the interposer contact 30 can be supported in an accurate position inside the contact positioning hole 21.

What is claimed is:

1. An interposer assembly comprising:
   a housing having:
   (a) an upper face and a lower face parallel to each other,
   (b) a plurality of contact positioning holes each having a first wall face and a second wall face facing each other and penetrating in a vertical direction between the upper face and the lower face of the housing,
   (c) a pair of slit portions in each of the plurality of contact positioning holes, the slit portions extending from and expanding the contact positioning hole in a widthwise direction transverse to the vertical direction, and
   (d) a retaining protrusion formed on the first wall face of each of the plurality of contact positioning holes; and
   a plurality of elastically deformable interposer contacts each:
   (a) having a vertical dimension longer than a thickness of the housing between the upper face and the lower face while being unloaded,
   (b) inserted into each of the contact positioning holes and elastically deformed by pressing a first electronic component toward the upper face and pressing a second electronic component toward the lower face to make electrical connection between the first electronic component and the second electronic component and retained inside the contact positioning hole by the retaining protrusion,
   (c) having a base portion having a pair of shoulder portions protruding from both sides in the widthwise direction and positioned closer to the first wall face, and
   (d) having a pair of contact arm portions each having one bulge toward the first wall face starting on an upper end or a lower end of the base portion, respectively, then curved toward the second wall face and extending toward each other via upper and lower vertices, respectively;
   wherein the base portion is closer to the second wall face than the two bulges.

2. The interposer assembly according to claim 1, wherein each of the pair of slit portions in the housing has a catching portion catching the shoulder portion of the interposer contact inserted from the upper face to a predetermined position for blocking further insertion of the interposer contact toward the lower face.

3. The interposer assembly according to claim 2, wherein each interposer contact is spaced from the second wall face of each of the contact positioning holes in the housing both while unloaded and while being pressed by the first component and the second component.

4. The interposer assembly according to claim 3, wherein the pair of contact arm portions extend substantially vertically starting on both upper and lower ends of the base portion.

5. The interposer assembly according to claim 4, wherein when the interposer contact is inside the contact positioning hole, the base portion is closer to the first wall face of the contact positioning hole.

6. The interposer assembly according to claim 2, wherein each of the slit portions terminates at the catching portion in the vertical direction.

7. The interposer assembly according to claim 6, wherein the catching portion is positioned at a midpoint of the contact positioning hole in the vertical direction.

8. The interposer assembly according to claim 2, wherein each of the plurality of elastically deformable interposer contacts is simultaneously prevented from moving further toward the lower face of the housing by the pair of slit portions and from escaping through the upper face of the housing by the retaining protrusion.

9. The interposer assembly according to claim 1, wherein each interposer contact is spaced from the second wall face of each of the contact positioning holes in the housing both while unloaded and while being pressed by the first component and the second component.

10. The interposer assembly according to claim 9, wherein the pair of contact arm portions extend substantially vertically starting on both upper and lower ends of the base portion.

11. The interposer assembly according to claim 10, wherein when the interposer contact is inside the contact positioning hole, the base portion is closer to the first wall face of the contact positioning hole.

12. The interposer assembly according to claim 1, wherein the shoulder portions extend into the slit portions.

13. The interposer assembly according to claim 1, wherein each of the slit portions extends from the upper face to the lower face in the vertical direction.

14. The interposer assembly according to claim 1, wherein the first wall face has a retaining protrusion protruding into the contact positioning hole.

15. The interposer assembly according to claim 14, wherein the retaining protrusion has a slope extending progressively into the contact positioning hole starting at the upper face.

16. The interposer assembly according to claim 1, wherein each of the plurality of elastically deformable interposer contacts is simultaneously prevented from moving further toward the lower face of the housing by the pair of slit portions and from escaping through the upper face of the housing by the retaining protrusion.

* * * * *